(12) United States Patent
Centofante et al.

(10) Patent No.: US 7,607,221 B2
(45) Date of Patent: Oct. 27, 2009

(54) METHOD OF MAKING AN ELECTRONIC DEVICE HOUSING

(75) Inventors: Charles A. Centofante, Los Altos, CA (US); Brian Boothman, San Jose, CA (US)

(73) Assignee: Piranha Plastics, Santa Clara, CA (US)

( * ) Notice: Subject to any disclaimer, the term of this patent is extended or adjusted under 35 U.S.C. 154(b) by 934 days.

(21) Appl. No.: 10/982,700

(22) Filed: Nov. 4, 2004

(65) Prior Publication Data

US 2006/0092601 A1    May 4, 2006

(51) Int. Cl.
  *H05K 3/30* (2006.01)
  *G06K 7/06* (2006.01)
(52) U.S. Cl. .............. 29/832; 29/825; 29/830; 29/840; 235/441
(58) Field of Classification Search ............ 29/825, 29/830, 832, 840; 235/441
  See application file for complete search history.

(56) References Cited

U.S. PATENT DOCUMENTS

| | | | | |
|---|---|---|---|---|
| 4,758,876 A | * | 7/1988 | Calenda et al. | 257/665 |
| 5,397,857 A | * | 3/1995 | Farquhar et al. | 174/520 |
| 5,502,892 A | * | 4/1996 | Lien | 29/841 |
| 5,750,973 A | * | 5/1998 | Kaufman et al. | 235/441 |
| 5,833,785 A | * | 11/1998 | Centofante | 156/69 |
| 5,833,903 A | | 11/1998 | Centofante | |
| 5,964,595 A | | 10/1999 | Centofante | |
| 6,137,224 A | | 10/2000 | Centofante | |
| 6,139,304 A | | 10/2000 | Centofante | |
| 6,381,143 B1 | | 4/2002 | Nakamura | |
| 6,617,786 B1 | | 9/2003 | Centofante | |
| 7,030,316 B2 | * | 4/2006 | Centofante | 174/559 |

OTHER PUBLICATIONS

International Search Report and Written Opinion of the International Searching Authority, PCT Application Serial No. PCT/US05/40088, Jun. 18, 2008, 11 pp.

* cited by examiner

*Primary Examiner*—C. J Arbes
(74) *Attorney, Agent, or Firm*—Fish & Richardson P.C.

(57) ABSTRACT

An apparatus and methods are provided for housing an electronic device. In one implementation, a method of housing an electronic device includes positioning an electronic device on a base, over-molding a lid onto at least a portion of the base and a portion of the electronic device, the lid and the base comprising a housing for the electronic device, and over-molding a movable component to a portion of the housing. In another implementation a method for housing an electronic device includes positioning a housing for an electrical device within a first mold cavity of an assembly mold, the housing including a base and a lid, molding a movable component in a second mold cavity of the assembly mold, and attaching the movable component to the housing while both the movable component and the housing are within the assembly mold.

33 Claims, 13 Drawing Sheets

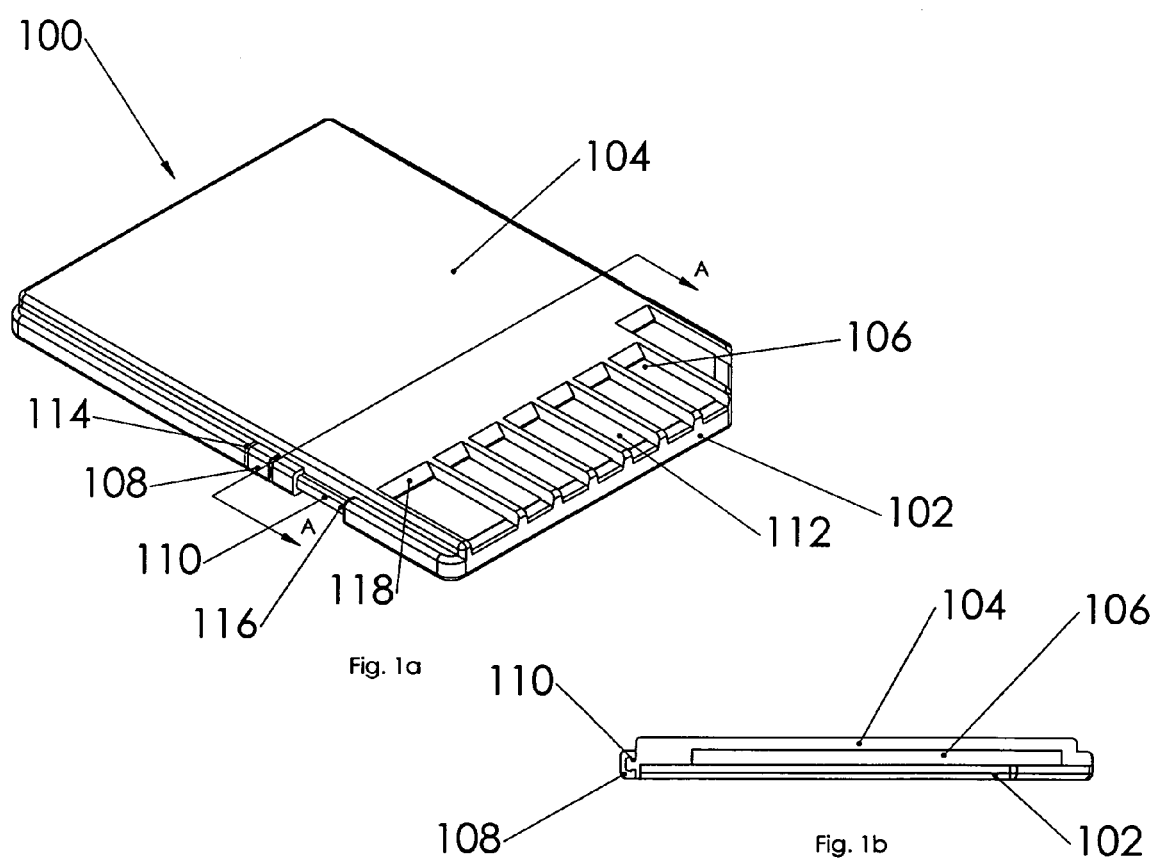

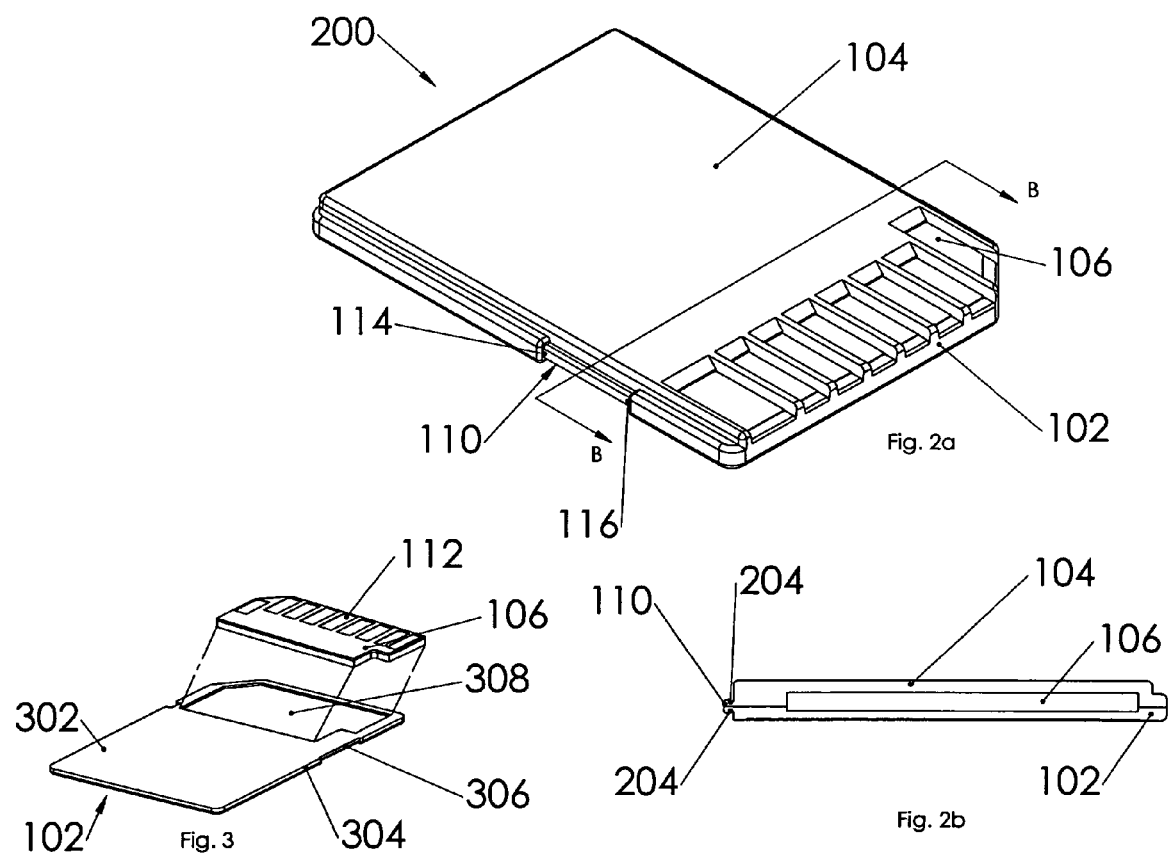

METHOD OF MAKING AN ELECTRONIC DEVICE HOUSING

BACKGROUND

The following description relates to housing an electronic device.

Computer memory and other peripheral devices can be built into a computer or can be external devices selectively attachable to a computer through an external interface. Certain peripheral devices are small enough to be housed in small, thin, card-shaped packages that are intended to be inserted into specially designed receptacles, typically found, for example, in portable personal computers or digital cameras. Because of the many possible methods of constructing the interface between the computer and such devices, standards have been developed by the Personal Computer Memory Card International Association ("PCMCIA"), Japan Electronic Data Interchange Council ("JEDIC"), International Organization for Standardization ("ISO"), Compact Flash Association ("CFA"), and others. Standards specify the shape and size of the device housing as well as the design of the connector/computer interface. Such peripheral devices, which may or may not conform to an industry standard, are generally referred to as PC cards. A PC card may include a movable component attached to the device housing, for example, a write protect switch to manually protect data stored on a PC card from being overwritten. A write protect switch can have an electrical contact with an electronic device housed in the PC card, or can provide write protect functions based only on the physical position of the switch.

One technique for providing a PC card that includes a write protect switch involves creating two injection molded shells, placing an electronic device between the two shells, positioning the write protect switch along an edge of the two shells, and mating the two shells together, e.g., by sonic welding or the use of an adhesive. The two mated shells form the housing for the PC card. The write protect switch typically is positioned before mating with a portion of the write protect switch being external to the PC card housing and a portion of the write protect switch being internal to the PC card housing. The shells are mated such that the write protect switch can slide, in response to a user supplied force, between the two shells. A typical write protect switch is small in size and, as a result, the manufacturing process of a PC card can lead to misalignment and other switch failures during assembly.

SUMMARY

The present specification describes methods and apparatus for housing an electronic device including a movable component.

In general, in one aspect, the invention includes a method of housing an electronic device. The method includes positioning an electronic device on a base, over-molding a lid onto at least a portion of the base and a portion of the electronic device, the lid and the base comprising a housing for the electronic device, and over-molding a movable component to a portion of the housing.

Implementations of the method may include one or more of the following features. The electronic device can be operable to store data and the movable component is configured to switch between a first position in which data can be written to the electronic device and a second position in which data cannot be written to the electronic device. The movable component can be molded to a rail on a side portion of the housing and can be formed from a dissimilar material than a material of the housing. The movable component can be a thermoplastic material. The thermoplastic material can have a lower melting point than a melting point of the base and the lid. The electronic device can be a thin walled semiconductor device including a printed circuit board and a flash memory module.

In general, in one aspect, the invention includes a method of housing an electronic device. The method includes molding a base, positioning an electronic device on the base, over-molding a lid onto at least a portion of the base and a portion of the electronic device, the lid and the base comprising a housing for the electronic device, and over-molding a movable component to a portion of the housing. In general, in another aspect, the invention includes a method of housing an electronic device that includes receiving a housing for an electronic device comprising a base and a lid, and over-molding a movable component to a portion of the housing.

In general, in one aspect, the invention includes an apparatus. The apparatus includes a base, an electronic device positioned on the base, a lid over-molded onto at least a portion of the base and the electronic device, the lid and the base housing the electronic device, and a movable component molded to at least a portion of the housing.

In general, in one aspect, the invention includes an apparatus. The apparatus includes a base, an electronic device positioned on the base, a lid fixed to at least a portion of the base and a portion of the electronic device, the lid and the base comprising a housing for the electronic device, and a movable component molded to a portion of the housing.

In general, in one aspect, the invention includes a method for housing an electronic device. The method includes positioning an electronic device housed within a housing in a first mold cavity of an assembly mold, the housing including a base and a lid, molding a movable component in a second mold cavity of the assembly mold, and attaching the movable component to the housing while both the movable component and the housing are within the assembly mold.

Implementations of the method may include one or more of the following features. The electronic device can be operable to store data and the movable component is configured to switch between a first position in which data can be written to the electronic device and a second position in which data cannot be written to the electronic device. The movable component can be molded to a rail on a side portion of the housing and can be formed from a dissimilar material than a material of the housing. The movable component can be a thermoplastic material. Attaching the movable component to the housing can further include moving one or more movable blocks within the assembly mold to advance the movable component to the housing.

In general, in one aspect, the invention includes a method for housing an electronic device. The method includes positioning a base within a first mold cavity of an assembly mold, positioning an electronic device on the base, over-molding a lid onto at least a portion of the base and a portion of the electronic device, the lid and the base comprising a housing for the electronic device, molding a movable component in a second mold cavity of the assembly mold, and attaching the movable component to the housing while both the movable component and the housing are within the assembly mold.

The invention can be implemented to realize some, all, or none of the following advantages. A solid housing for an electronic device is formed, which can be stronger, more durable and hold the electronic device more firmly in place than a housing formed by mating two shells with a void between the shells. The housing can be molded, instead of assembled, reducing the risk of damage to the electronic device during injection molding is reduced by limiting pressure on the device during molding to one direction. Molding the housing eliminates the need for sonic welding or other assembly techniques, which can cause misalignment, product variance, or failure, reducing manufacturing costs. Molding or assembling a movable component after forming the housing of the PC card can reduce the risk of misalignment or failure in providing the movable component. The movable component can be over-molded to the PC card housing after the housing has been created. The PC card can be assembled in-mold by molding a movable component and then attaching the movable component to the PC card housing. The housing and movable component can be molded and assembled in mold without being removed from the assembly molding apparatus. Further, over-molding a lid of the housing onto a prefabricated base can eliminate at least one fabrication step, that is, mating the lid and the base, e.g., by sonic welding or applying an adhesive. Additionally, over-molding the movable component directly into the lid and the base can eliminate another fabrication step, that is, assembling the movable component to a PC card housing.

The details of one or more embodiments of the invention are set forth in the accompanying drawings and the description below. Other features and advantages of the invention will become apparent from the description, the drawings, and the claims.

DRAWING DESCRIPTIONS

These and other aspects will now be described in detail with reference to the following drawings.

FIG. 1A shows a PC card including a movable component.

FIG. 1B is a cross-sectional view along line A-A of the PC card shown in FIG. 1A.

FIG. 2A shows a PC card without a movable component.

FIG. 2B is a cross-sectional view along line B-B of the PC card shown in FIG. 2A.

FIG. 3 is an exploded view of an electronic device and a housing base.

DETAILED DESCRIPTION

Figure 4:
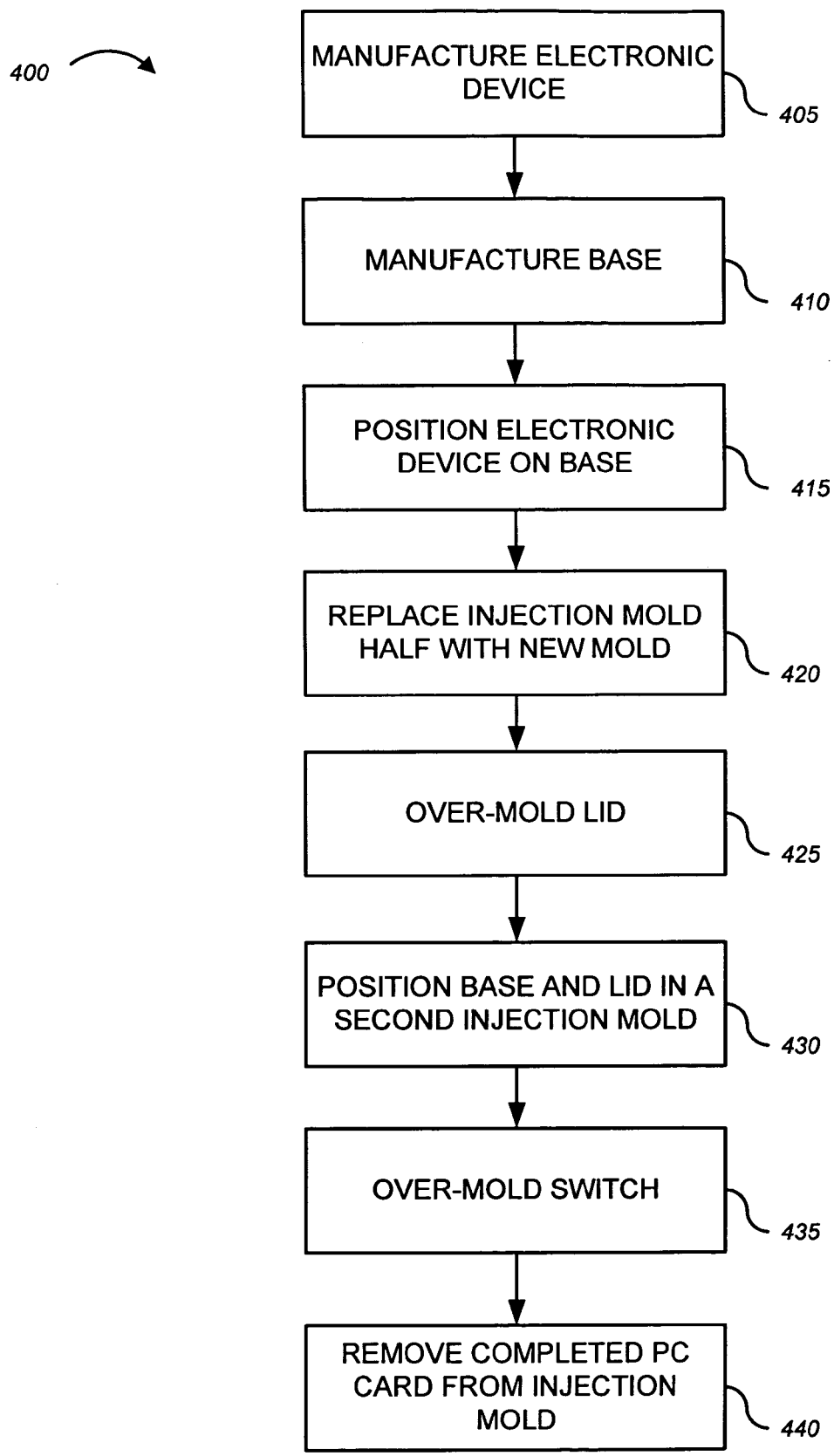
FIG. 4 is a flowchart showing a process for insert molding an electronic device.

FIG. 1A shows a PC card 100 formed from a base 102, a lid 104, a movable component 108, and an electronic device 106 that is partially enclosed by the base 102 and the lid 104. The base 102 is manufactured, for example, by injection molding or die-cutting. The electronic device 106 is positioned on the base, which can also function as a locator during an overmold process for the lid 104. The electronic device 106 includes an exposed interface 112 for interfacing with another electronic device. The lid 104 is manufactured, for example, by die-cutting or injection molded directly onto the base 102.

The lid 104 can then be positioned, or molded over the base 102, and at least a portion of the electronic device 106, thereby creating a solid, durable housing for the electronic device 106. The lid 104, when positioned over the base 102, leaves an opening 118 that exposes a portion of the electronic device 106 including an interface 112.

A movable component 108 is attached to the housing formed by the base 102 and lid 104 such that the movable component 108 can slide between endpoints 114 and 116 on a rail 110. FIG. 1B illustrates a cross-sectional view of the PC card 100 shown in FIG. 1A taken along line A-A and including the movable component 108, the rail 110, the lid 104, the base 102, and the electronic device 106. The lid 104, the base 102, and the movable component 108 can be formed from any suitable material, including, for example, a thermoplastic material such as an acrylonitrile butadiene styrene (ABS), polycarbonate, ABS-polycarbonate, styrene, polystyrene, acrylic, nylon or a polyester. Alternatively, in one implementation, the base 102 and/or the lid 104 are formed of a non-polymer material such as metal. The above list is not exhaustive and other suitable materials can be used to form the lid 104 and the base 102. Additionally, a different material can be used to form each of the lid 104 and the base 102. In one implementation, the movable component 108 is over-molded to the housing and can be formed from a different material than the base 102 and lid 104 such that the movable component 108 does not bond with the rail 110 during the molding process. For example, in one implementation, movable component 108 is formed from a polymer having a lower melting point from that of the base 102 or the lid 104.

Figure 9:
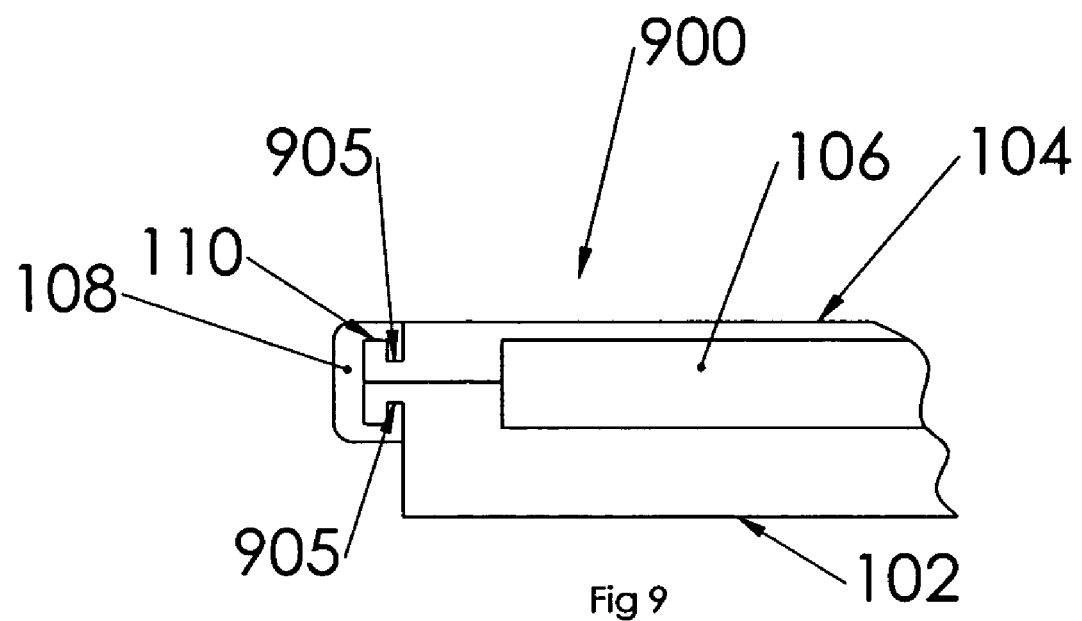
FIG. 9 is a cross-sectional view of a molded movable component on a PC card.
Figure 10:
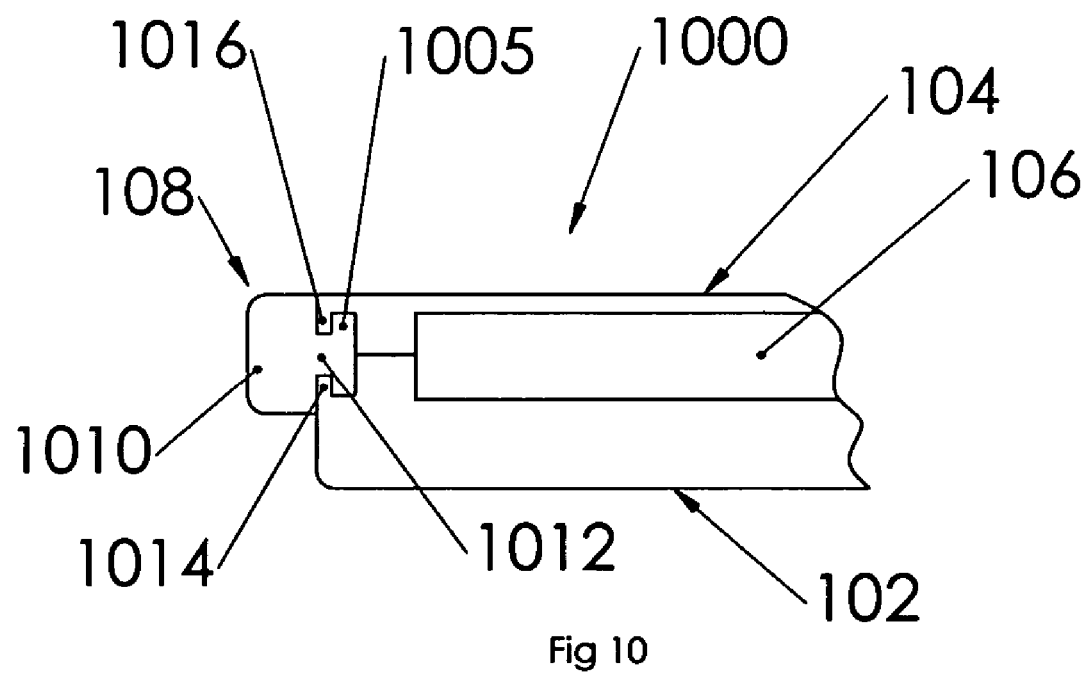
FIG. 10 is a cross-sectional view of an alternative movable component on a PC card Like reference symbols in the various drawings indicate like elements.

FIGS. 2A and 2B show a PC card 200 which is the PC card 100 (FIGS. 1A, 1B) without the movable component 108 attached to the rail 110. A portion of the sidewall for the base 102 and the lid 104 together form the rail 110. Alternatively, the rail 110 can be formed wholly from the base 102 or the lid 104. In one implementation, the rail 110 provides a slot 204 on either or both of the top and bottom of the rail 110 for securing the movable component 108 to the rail 110, while permitting the movable component 108 to slide along the length of the rail 110 between rail endpoints 114 and 116. The rail 110 can be formed in any shape that allows the movable component 108 to slide between the endpoints 114 and 116. For example, alternative implementations of the rail 110 and the movable component 108 are illustrated in FIGS. 9 and 10 (described below).

An embodiment of the base 102 is shown in FIG. 3. An example of an injection molded base shell is disclosed in U.S. Pat. No. 5,833,785, issued on Nov. 10, 1998 to Centofante and entitled "Enclosing A Small-Format Electrical Device", which is hereby incorporated by reference in its entirety. The lid 104 can also be injection molded in a similar manner. The base 102 includes a planar segment 302 and a side 304. The side 304 including a rail segment 306. The rail segment 306, when combined with a similar rail segment of the lid 104 (not shown), forms the rail 110. In alternative implementations, a rail can be positioned on another edge or face of the PC card 200. For example, a rail can be molded into a different side than shown in FIG. 2. Additionally, in one implementation, either the base 102 or the lid 104 includes the entire rail 110.

FIG. 3 shows one embodiment of the base 102 that includes a recess 308 for receiving an electronic device 106. In another embodiment a base includes an side extending the entire perimeter of the base with the exception of an opening. A recess for receiving an electronic device can be formed in the base, such that an edge of the recess coincides with the opening in the side of the base. The electronic device 106 is positioned within the recess 308 so that an interface on the electronic device 106 is accessible through the opening to permit interfacing with another electronic device 106. The recess 308 limits lateral movement of the electronic device 106 within the base 102, thereby holding the electronic device 106 stationary during an over-molding process or other assembly of a lid to the base 102. The electronic device 106 is prevented from moving towards the opening by partial sides providing the boundary of the opening and forming a partial fourth side to the recess 308.

Referring back to FIG. 3, the electronic device 106 can be, for example, a thin walled semiconductor device, such as a printed circuit board (PCB) as shown. The electronic device 106 has an interface 112 that can include, for example, conductor contacts, such as gold traces, for interfacing with another electronic device. The interface 112 can be configured and attached to the electronic device 106 using conventional techniques and optionally, the interface can be configured according to a standard set by CFA, PCMICIA, JEDIC, ISO, or others. When assembled, the housing forms a thin rectilinear solid, with the lid 104 and the base 102 defining planar surfaces of the housing and a shallow side wall, and providing a rigid housing for the electronic device 106 with access to the interface 112. In one implementation, the PC card can include a PCB configured to form a flash memory module for insertion into an electronic device such as a digital camera or a mobile phone. For example the technique can be used to form a memory module such as the SD Card, a memory module manufactured by SanDisk having finished dimensions of approximately 24 mm×32 mm×2 mm, and having a visible switch portion of dimensions approximately 1 mm×3 mm×1.4 mm.

The movable component 108, positioned in one implementation on a side of the housing, provides additionally functionality to the PC card 100. For example, as a write protect switch, the movable component 108 in a first position (e.g., endpoint 114) prevents data from being written to a memory (e.g., a flash memory module) of the electronic device 106. In a second position (e.g., endpoint 116), the write protect switch allows data to be written to the flash memory module of the electronic device 106. Typically, when a PC card 100 is inserted into a device, the position of the write protect switch is mechanically discerned by the device. For example, when the write-protect switch is in a first position, a first connection is created between the device and the PC card 100. The first connection provides information to the device indicating that writing to the PC card 100 is not allowed. When the write protect switch is in the second position, a second connection between the device and the PC card 100 is formed. The second connection provides information to the device indicating that writing to the PC card 100 is allowed.

The movable component 108 can slide between positions 114 and 116 along the rail 110 in response to a user supplied force. In one implementation the force is manually supplied by a user's finger. In another implementation, the moveable component 108 is designed to resist movement below a threshold applied force. The threshold applied force, in one implementation, can be fixed by one or more standards.

Over-Molded Switch

FIG. 4 shows a process 400 for forming a housing from base 102 and lid 104 and over-molding movable component 108 to the housing to form PC card 100. The electronic device 106 is manufactured according to an industry standard or otherwise (step 405). The base 102 can be manufactured by molding in an injection mold, die cutting or other suitable techniques (step 410). The order of steps 405 and 410 is not important, and either the electronic device 106 or the base 102 can be manufactured first.

The electronic device 106 is positioned on the base 102 (step 415). Referring to FIG. 3, in one embodiment, the electronic device 106 can be seated within a recess 308 that provides a friction fit to hold the electronic device 106 in place during over-molding of the lid 104. Forming a recess 308 for the electronic device 106 can also provide a thinner PC card 100. In an alternative implementation, raised members can project sufficiently from the surface of the base or recess to engage a corresponding recess or formed in the electronic device, thereby holding the electronic device in place during over-molding of the lid. Alternatively, the electronic device can be positioned in a desired position on base and held in place by use of an adhesive, a vacuum system or other convenient means.

Figure 5:
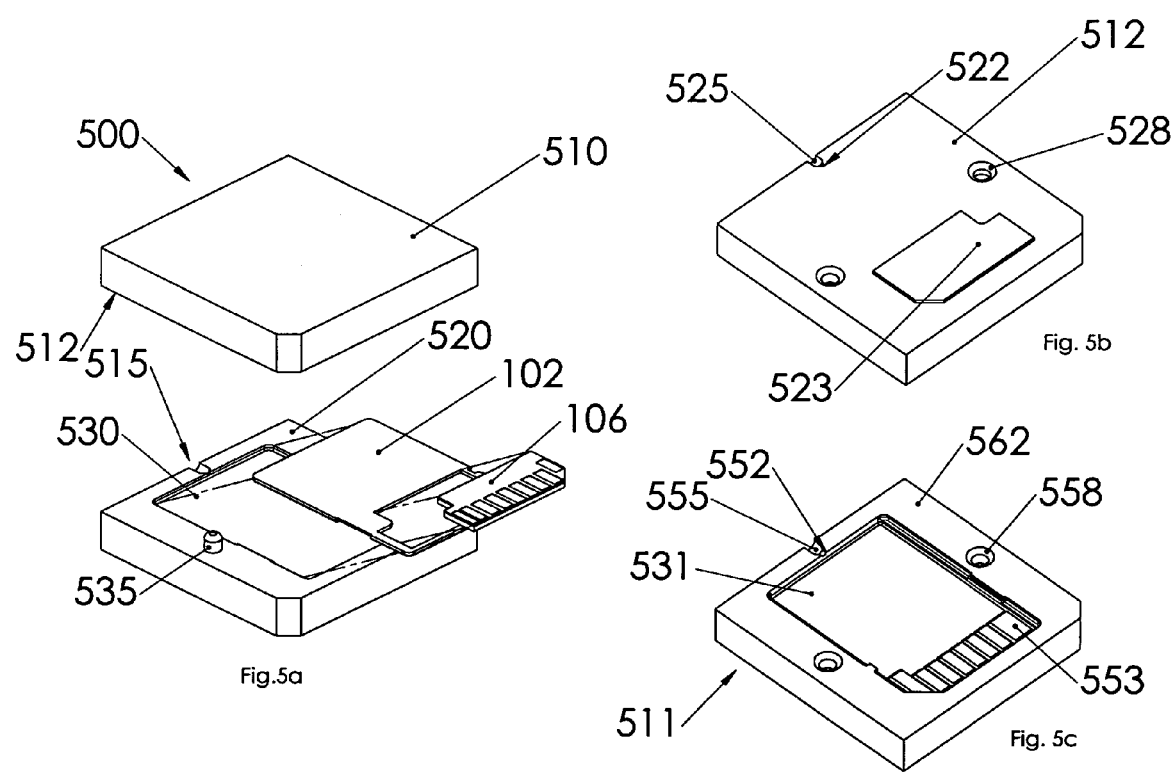
FIGS. 5A-5C show an exploded view of an injection molding apparatus for molding a base and a lid of a PC card.

Referring to FIG. 5A, if the base 102 was formed by injection molding, the electronic device 106 can be positioned on the base 102 while still in the injection mold, and one half of the injection mold 500 can be replaced with a mold cavity for forming the lid 104, instead of the base 102 (step 420). If the base 102 was otherwise manufactured, then the base 102 and the electronic device 106 are positioned in an injection mold that will be used to form the lid. The lid 104 is then molded over the base 102 and at least a portion of the electronic device 106 (step 425). A shut-off mechanism is used to prevent over-molding of at least a portion of the electronic device 106, particularly the interface 112. The base 102 functions as a locator for the electronic device 106 during the over-mold process, thereby eliminating the need for locator pins and corresponding holes in the electronic device 106, and preventing movement of the electronic device. After the injection is complete, the mold material is allowed to harden, the injection mold 500 is opened and the resulting PC card 200 (FIG. 2) can be removed.

Figure 6:
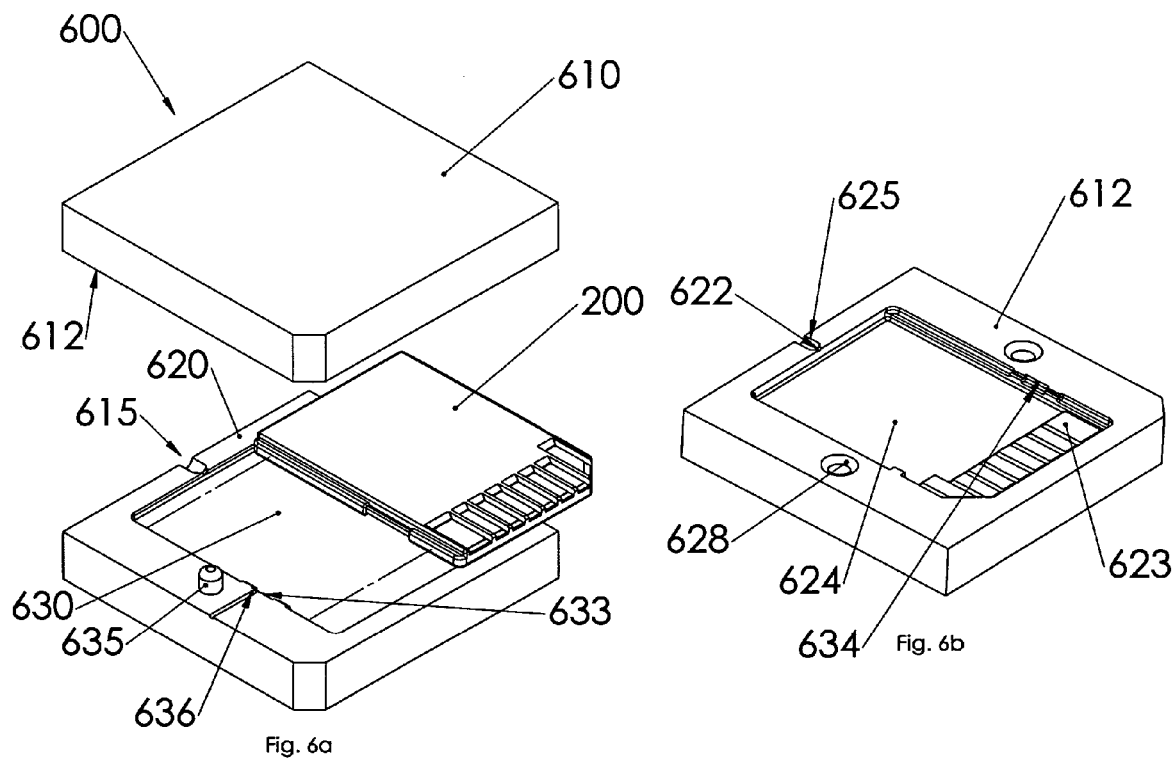
FIGS. 6A and 6B show an exploded view of an injection molding apparatus for molding a switch to a PC card.

The PC card 200 is then placed within a second injection mold 600, shown in FIGS. 6a and 6b, configured to mold the movable component 108 (step 430). Material is injected into the mold 600, thereby molding the movable component 108 over the PC card 200 (step 435). The movable component can be formed from a material that is dissimilar from the material used to form the base 102 and the lid 104 of the PC card 200. For example, a thermoplastic material can be selected that does not bond to the base 102 and lid 104 of the PC card 200 during molding. The selected mold material is allowed to harden, the injection mold 600 is opened, and the resulting PC card 100 (FIGS. 1A, 1B), which includes movable component 108, is removed (step 440).

A description of an exemplary method and apparatus for injection molding is provided in U.S. Pat. No. 5,833,903, issued on Nov. 10, 1998, to Centofante and entitled "Injection Molding Encapsulation For An Electronic Device Directly Onto A Substrate", which is hereby incorporated by reference in its entirety. In one implementation, an exemplary injection molding apparatus shown in FIGS. 5a-5c can be used to mold the base 102 and over-mold the lid 104. For illustrative purposes, the technique shall be described to create the embodiment of a PC card 200 as shown in FIG. 2, although the technique described below in reference to FIGS. 5a and 5b can be used to form a PC card of a different configuration.

Referring to FIG. 5a, the injection mold 500 includes a top plate 510 and a base plate 520. The intersection of the top plate 510 and the base plate 520 includes an inlet 515 that provides a path for injecting a mold material, e.g., a thermoplastic, into the injection mold 500. FIG. 5B shows the inner surface 512 of the top plate 510, which includes a distribution runner 525 and a gate 522. The gate 522 can communicate with the inlet 515 through the distribution runner 525. In an alternative implementation, the gate 522 can communicate directly with the inlet 515. The gate 522 allows the mold material to enter the mold cavity 530 which forms the shape of the base 102. A shut off mechanism 523 in the top plate 510 is a raised area that prevents thermoplastic material from forming in an area of the mold cavity 530 in order to provide a recessed area (e.g., recessed area 308 of FIG. 3) for positioning the electronic device 106.

The base plate 520 includes pins 535 configured to engage corresponding apertures 528 formed in the top plate 510, to couple the top and base plates. The base plate 520 includes a mold cavity 530 for molding the base 102 or alternatively, for seating the prefabricated base 102 within the mold 500 during over-molding of the lid 104. A mold material is injected through the inlet 515 into the mold cavity 530 to form the base 102.

FIG. 5c illustrates an inner surface 562 of a top plate 511 used for over-molding the lid 104. The intersection of the top plate 511 and the base plate 520 includes an inlet 515 that provides a path for injecting a mold material, such as thermoplastic, into the injection mold 500. Top plate 511 includes a distribution runner 555 and a gate 552. The gate 552 can communicate with the inlet 515 through the distribution runner 555, or alternatively the gate 552 can communicate directly with the inlet 515. The gate 552 allows the mold material to enter the top mold cavity 531 which forms the shape of the over-molded lid 104. The top mold cavity 531 includes a shut off mechanism 553 that prevents mold material from covering a portion of the electronic device 106. The shut off mechanism 553 can be a raised area of the top mold cavity 531 that contacts a portion of the electronic device 106 when the mold is closed, thereby preventing a cavity from forming in this area that would receive the mold material.

After the base 102 has been formed, an electronic device 106 is positioned on and optionally attached to the base 102 during the over-molding process. After the base 102 and the electronic device 106 are positioned within the recess 530 of base plate 520, the top plate 511 is secured to the base plate 520 with the pins 535 engaged in the corresponding apertures 558. A mold material is injected through the inlet 515 into the mold cavity 531 to cover a portion of the electronic device 106 as well as the planar surface 10 of the base 102, thereby forming the lid 104. The thickness of the lid 104 varies depending on the surface topology of the base 102. For example, the base 102 can include sidewalls and surface features of varying heights. In one embodiment, the lid 104 is over-molded so that the over-mold increases the height of the finished PC card from the base 102 by approximately 0.2 mm over the existing sidewalls of base 102.

The mold material can be thermoplastic material, for example, ABS, and can be the same color as the base 102 or a different color. During the injection molding process, the thermoplastic material bonds to the base 102 and to at least some portion of the electronic device 106 that is not protected by the shut off mechanism 553. The heat and pressure from the injection molding process melts the surface of the base 102 that is in contact with the molding material, resulting in chemical bond between the base 102 and the lid 104. Additionally, the plastic contracts as it cools forming a mechanical bond between the base 102 and the lid 104 as the lid 104 cools. Over-molding with a thermoplastic material from a similar plastic family to the material used to form the base 102 can improve bonding between the lid 104 and the base 102.

In one implementation, risk of damage to the electronic device 106 as a result of the high pressure over-mold can be reduced by injecting a first layer of plastic at low pressure to form a protective shell over the electronic device 106. The plastic can be a chemically activated thermal set material that quickly hardens. A second layer of plastic at a high pressure is then injected to complete formation of the over-molded lid. The first and second layers can be formed during a single mold process (i e., without removing the base 102 and electronic device 106 from the mold cavity), or as a two-step molding process.

In one implementation, an exemplary injection molding apparatus 600 shown in FIGS. 6a-6b can be used to mold the movable component 108 to PC card 200. For illustrative purposes, the technique shall be described to create a PC card 100 as shown in FIG. 1, although the technique described below in reference to FIGS. 6A-B can be used to form a PC card of a different configuration, for example, a PC card having a movable component as shown in FIGS. 8 and 9 (described further below).

Referring to FIG. 6a, the injection mold 600 includes a top plate 610 and a base plate 620. The intersection of the top plate 612 and the base plate 620 includes an inlet 615 that provides a path for injecting a mold material, e.g., a thermoplastic, into the injection mold 600. FIG. 6b shows the inner surface 612 of the top plate 610, which includes a distribution runner 625 and a gate 622. The gate 622 can communicate with the inlet 615 through the distribution runner 625. In an alternative implementation, the gate 622 can communicate directly with the inlet 615. The inner surface also includes a recess 624 configured to receive a portion of the PC card 200. The gate 622 allows the mold material to enter the top mold cavity 634, which forms the shape of a portion of the movable component 108.

The base plate 620 includes pins 635 configured to engage corresponding apertures 628 formed in the top plate 610, to couple the top and base plates. The base plate 620 includes a recess 630 for seating the PC card 200 with an additional recessed area 633 for molding a portion the movable component 108. When the top plate 610 and the base plate 620 are joined the recess 633 and the top mold cavity 634 to form a mold cavity configured to mold the movable component 108. A portion of the rail 110 is positioned within the mold cavity formed by the recess 633 and top mold cavity 634 so that the movable component 108 can be over-molded to a portion of the rail 110. A thermoplastic material is injected through a second inlet 636 into the mold cavity, formed by recess 633 and top mold cavity 634, to form the movable component 108. The movable component 108 is molded over a portion of the base 102 and the lid 104. A shut-off mechanism 623 is used to prevent over-molding of the housing outside a portion of the rail 110 including preventing mold material from entering the interface of the electronic device 106.

In one implementation, the movable component 108 is molded from a thermoplastic material having a lower melting temperature than the thermoplastic material used to form the base 102 and the lid 104. Using the second inlet 636 can also facilitate the use of a different thermoplastic material than the thermoplastic material used to mold the base 102 and the lid 104. The lower melting point prevents the base 102 or the lid 104 from melting while over-molding the movable component 108. The material used to mold the movable component 108 does not bond to the rail 110 so that the movable component of the finished PC card 100 can move along the rail 110. After the injection is complete, the mold material is allowed to harden. The injection mold 600 is opened and the resulting PC card 100 can be removed.

In-Mold Assembly

In one implementation, the movable component 108 can be automatically attached to the base 102 and the lid 104 after molding the movable component 108, for example, by exerting a force on the movable component 108 to snap it to the rail 110 formed on the housing of a PC card 200.

Figure 7:
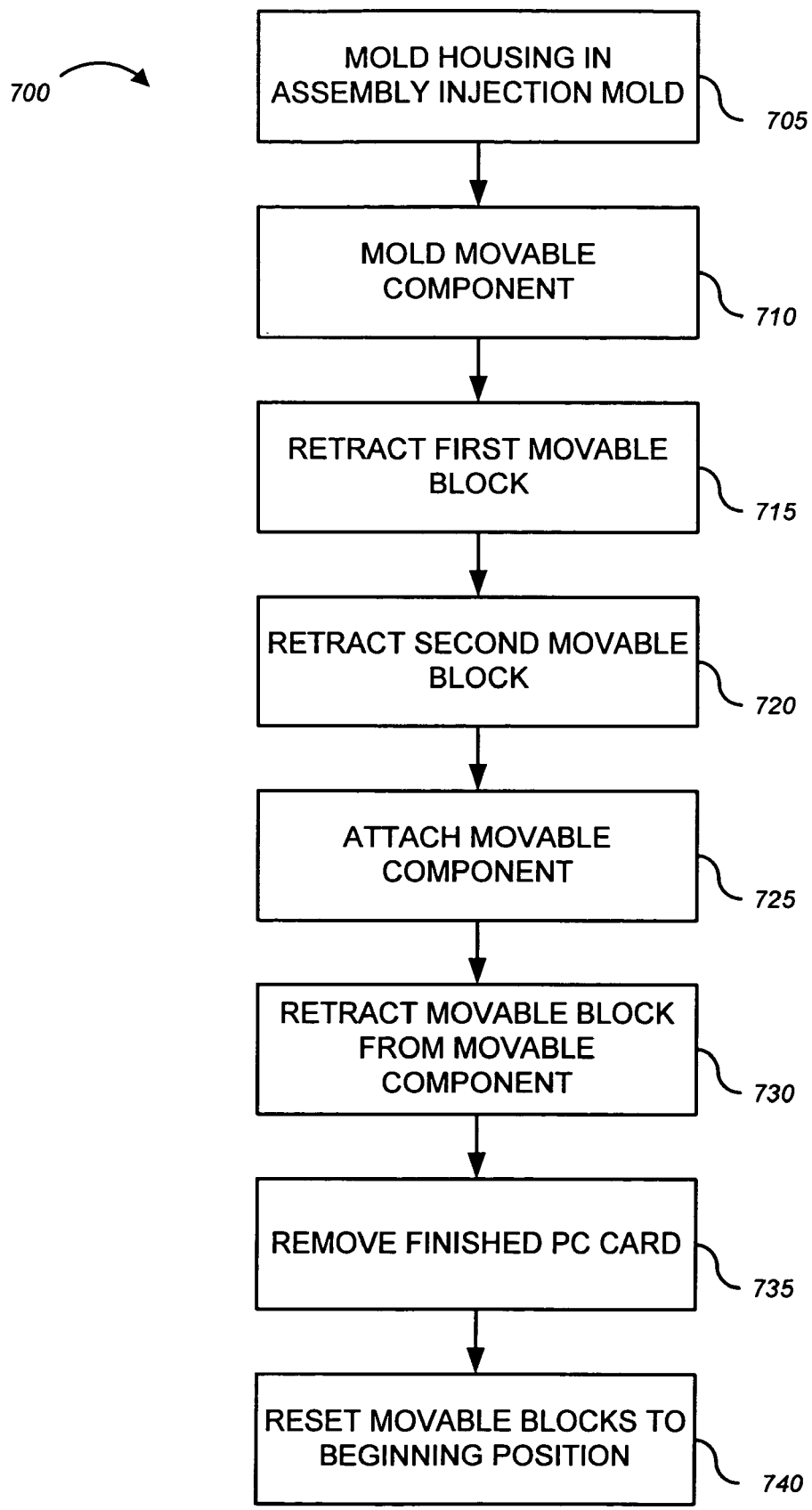
FIG. 7 is a flowchart showing a process for in-mold assembly of a PC card with a movable component.

In one implementation, the movable component 108 can be formed and attached to a PC card 200 while within an assembly mold apparatus. FIG. 7 shows a process 700 for in-mold assembly of a PC card, e.g., PC card 100 shown in FIGS. 1A, 1B. A PC card housing an electronic device is molded (step 705). The PC card can be PC card 200 formed as described above. In one implementation, the PC card 200 is molded in an assembly mold apparatus that can be used to mold the movable component 108 and attach it to the PC card 200 to form a PC card 100 as shown in FIGS. 1A, 1B. An exemplary assembly apparatus 800 is shown in FIGS. 8A-8F.

The PC card 200 can be molded similarly to the process for molding PC card 200 described above in steps 405-425 of FIG. 4. The PC card 200 can either be molded within the assembly apparatus 800, or molded elsewhere and then positioned within the assembly apparatus 800.

The movable component 108 is molded within the assembly apparatus (step 710). If using the assembly apparatus 800 to form the PC card 200, the movable component 108 can be molded concurrently or separately in time from the PC card 200. In one implementation, the lid 104 of the PC card 200 is over-molded at substantially the same time as the movable component 108 is molded. The movable component 108 can be molded using a same or different material as the base 102 or the lid 104.

The assembly apparatus includes a mold cavity 802 for molding the movable component 108. The mold cavity 802 is formed from movable blocks 804 and 806 and mold base 808. An injection molding process can be used to form the movable component 108 in the mold cavity 802. For example, a separate gate and distribution runner can be included within the molding apparatus for providing thermoplastic to the mold cavity 802. The assembly apparatus 800 also includes mold cavity 810 for holding a PC card 200 (FIG. 2). As discussed above, the mold cavity 810 can be used to mold the base 102 and to hold the base 102 during over-molding of the lid 104. The mold cavity 810 includes the mold base 808 and a movable block 812. One or more second halves of the assembly apparatus (not shown) provide the corresponding mold shapes and shut-offs for molding of the base 102 and/or the lid 104. Movable block 812, embedded within the mold base 808, separates PC card 200 from movable component 108. The movable blocks 804, 806, and 812 can be moved to different positions through mechanical, electrical, or a combination of mechanical and electrical means. In one implementation, the movable blocks 804, 806, and 812 are moved pneumatically. In an alternative implementation, the movable blocks 804, 806, and 812 are moved hydraulically.

Figure 8A:
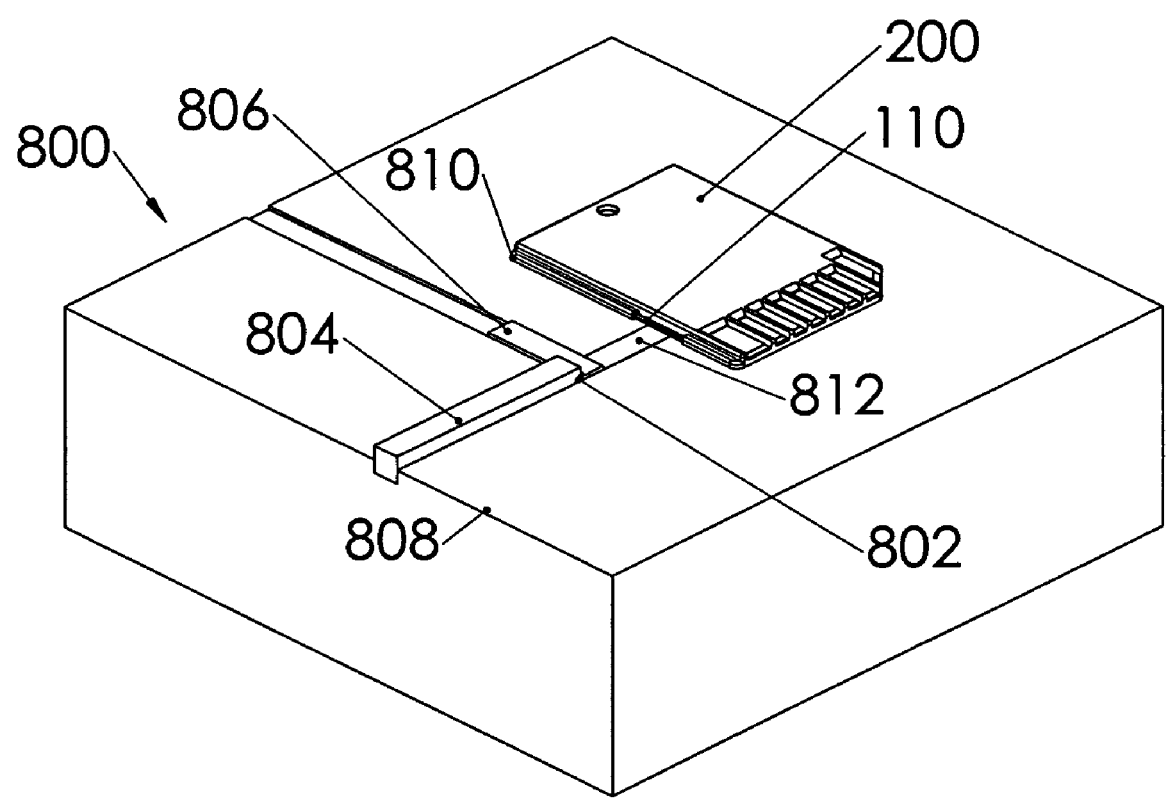
FIGS. 8A-8F show an operation of an in-mold assembly apparatus.
Figure 8B:
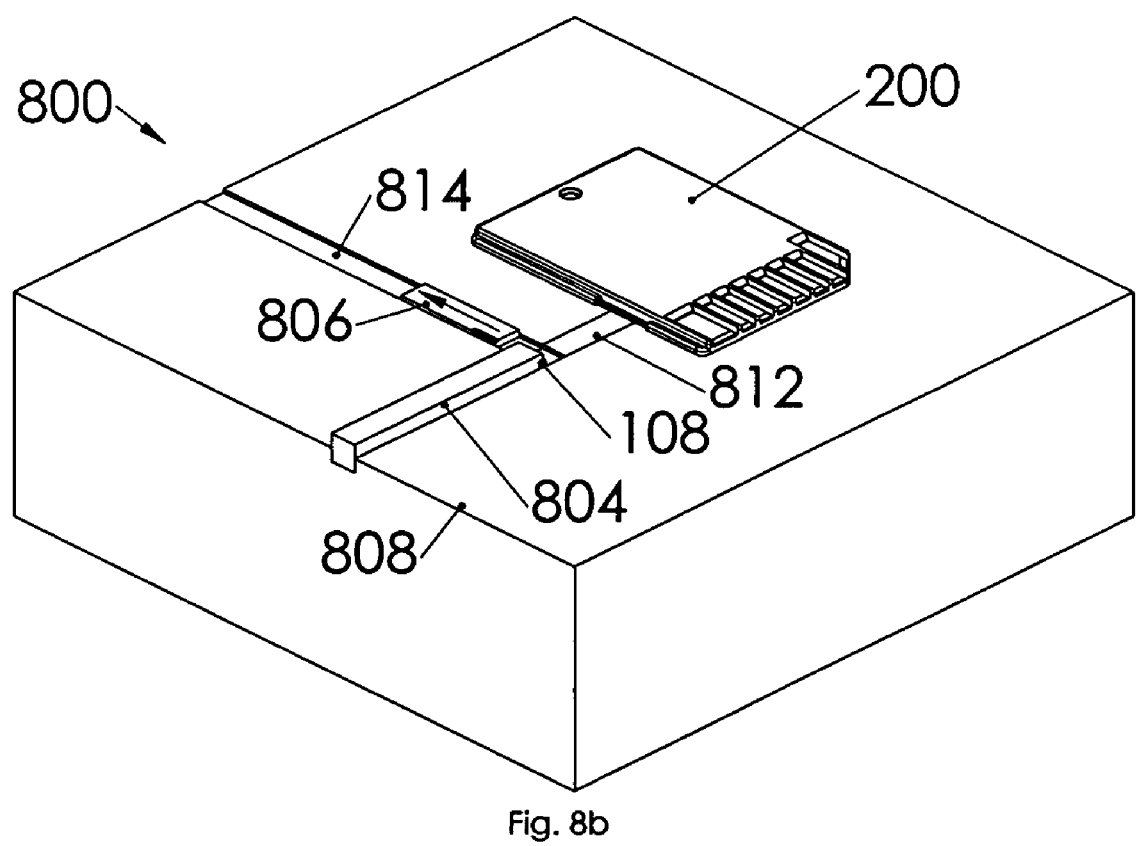
Figure 8C:
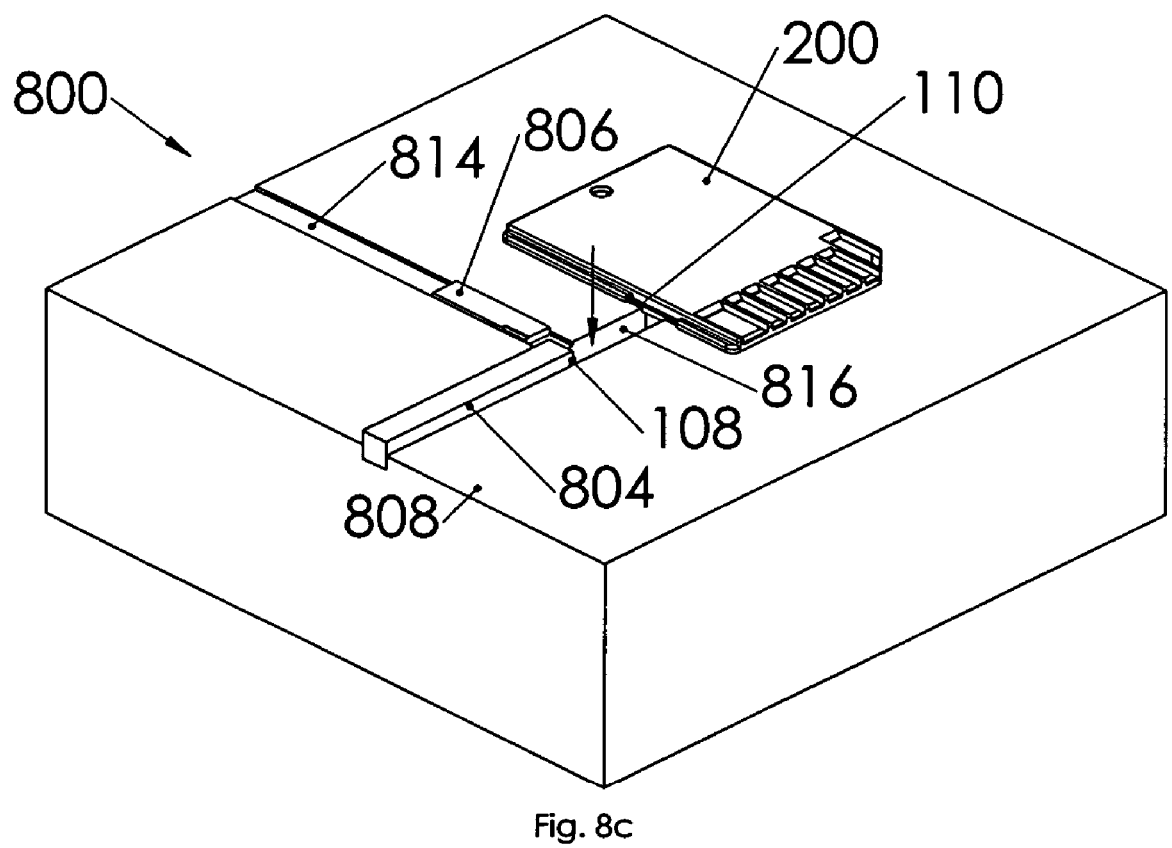

In operation, the assembly apparatus 800 can attach the movable component 108 to the PC card 200 to form completed the PC card 100. As shown in FIG. 8b, movable block 806 retracts into a slot 814 (step 715). After the movable block 806 retracts, the movable component 108 remains coupled to a face of the movable block 804; removing the movable block 806 reveals a face of the movable component 108 that will attach to the rail 110. As shown in FIG. 8c, the movable block 812 retracts, for example, into the body of the mold base 808 (step 720). In one implementation, the movable block 812 retracts to provide slot 816 such that the movable block 804 can advance, with the movable component 108, toward the rail 110 of PC card 200.

Figure 8D:
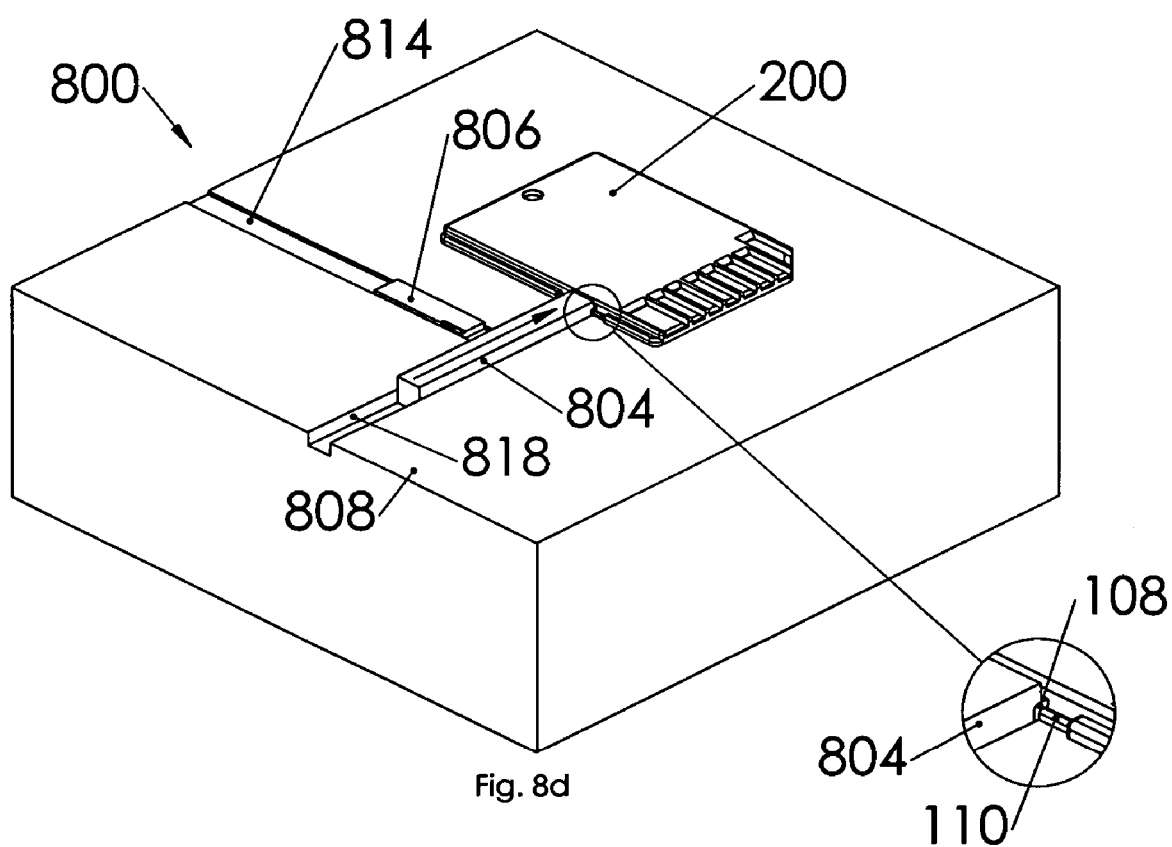
Figure 8E:
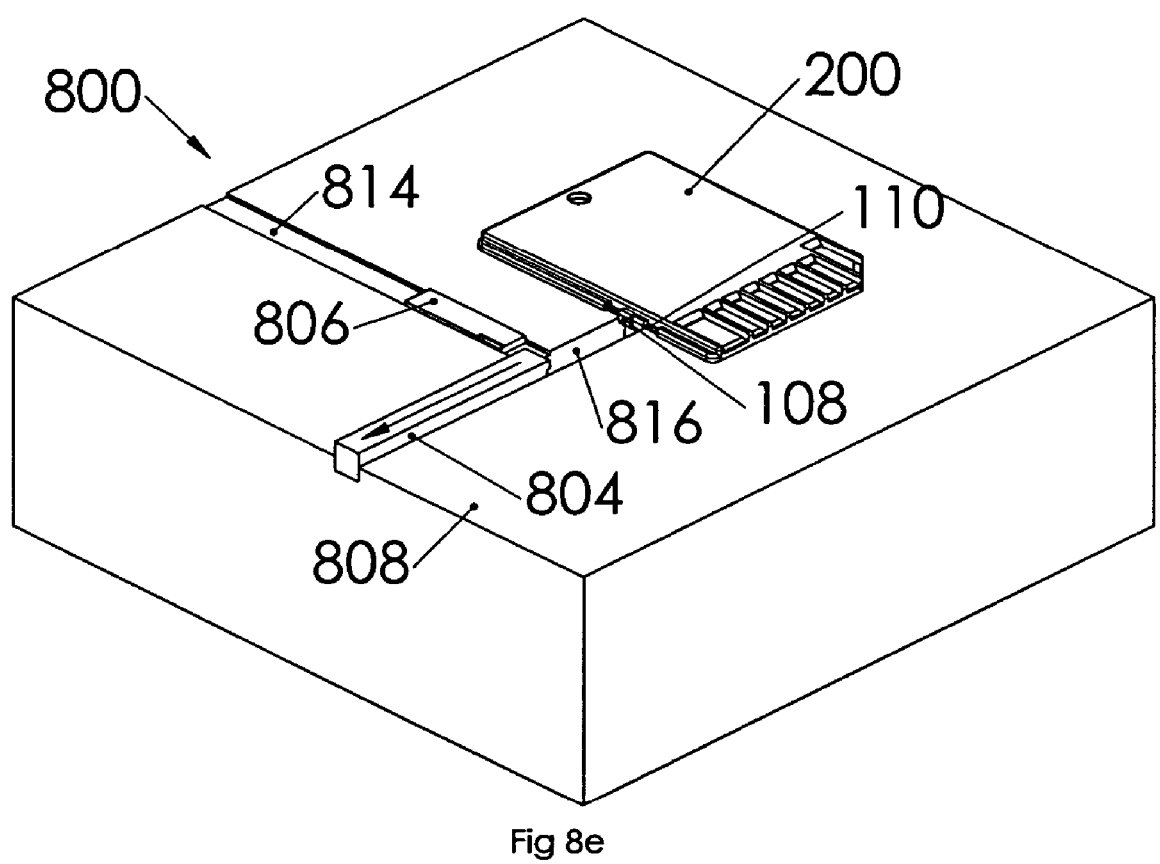

As shown in FIG. 8d, the movable block 804 advances with the movable component 108 through the slot 816 toward rail 110 of PC card 200 (step 725). The movable block 804 advances such that the movable component 108 contacts the rail 110 and snaps into position on the rail 110. When the movable component 108 attaches to the rail 110, a completed PC card 100 is formed. The movable block 804 can then retract from the rail 110 to the original position leaving the movable component 108 attached to the rail 110 (step 730) as shown in FIG. 8e.

Figure 8F:
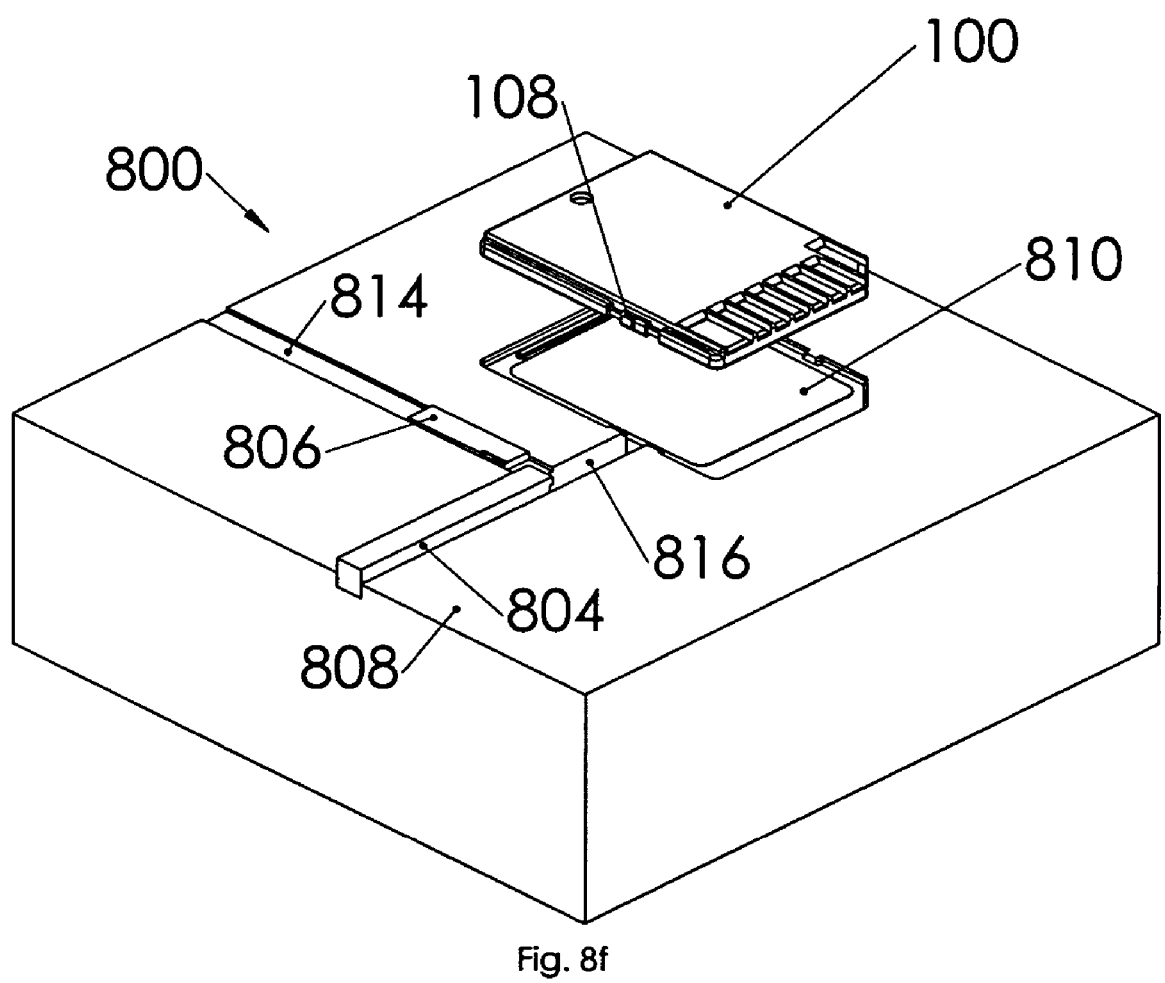

The completed PC card 100 can then be removed from the mold base 808 (step 735), as shown in FIG. 8f, revealing mold cavity 810. The movable blocks 806 and 812 can return to their respective starting positions as shown in FIG. 8a for another molding and assembly process (step 740). Upon repositioning of the movable blocks 804, 806, and 812, the mold cavity 802 is again provided for molding a new movable component 108. In one implementation, the second half of the assembly apparatus is opened after molding of the movable component 108 for the assembly process. In an alternative implementation, the assembly process can occur while the mold is closed such that the mold is only opened after assembly is complete and the PC card 100 is removed.

FIG. 9 shows a partial cross-sectional view 900 along the line A-A of FIG. 1a illustrating one implementation of one design for attaching the movable component 108 to the rail 110. In FIG. 9, the movable component 108 surrounds the rail 110. The rail 110 includes a recessed portion 905 on each side of the rail 110. Recessed slots 905 allows the movable component 108 to be securely attached to the rail 110 while being able to slide along the length of the rail 110.

FIG. 10 shows a partial cross-sectional view 1000 along the line A-A of FIG. 1A of another implementation of another design for attaching movable component 108. In FIG. 10, instead of a rail protruding from the housing (e.g., rail 110), a rail cavity is molded within the lid 104 and base 102 to form a rail cavity. The movable component 108 is formed by injection molding an internal portion 1005 of the movable component 108 within the rail cavity and an external portion 1010 of the movable component 108. The internal component 1005 and external component 1010 are separated by a region of reduced thickness 1012 that bridges the internal component 1005 and external component 1010. The region of reduced thickness 1012 is formed by protrusions 1014 and 1016 in the base 102 and lid 104 respectively. Protrusions 1014 and 1016 allow the movable component 108 to be secured to the base 102 and lid 104 while the rail cavity 1005 allows the movable component 108 to slide the length of the rail cavity 1005. Other designs for attaching a movable component are possible.

A robotic or computer controlled apparatus can be used to perform some of the steps described herein, such as to position a electronic device onto a base, to transfer a base to the injection mold for over molding and/or to remove a PC card from an injection mold. Additionally, the robotic or computer controlled apparatus can be used to operate the movable blocks in the in-mold assembly process for attaching the movable component to the PC card.

Although only a few embodiments have been described in detail above, other modifications are possible. For example, the techniques described can be used to at least partially enclose more than one electronic device in a housing. A housing can be configured other than as a rectilinear solid. The techniques described herein are not limited to forming a "PC card" and can be used to house any electronic device. The steps of the methods disclosed herein can be performed in a different order and still achieve desirable results. Other embodiments may be within the scope of the following claims.

What is claimed is:

1. A method of housing an electronic device, comprising:
   positioning an electronic device on a base;
   over-molding a lid onto at least a portion of the base and a portion of the electronic device, the lid and the base comprising a housing for the electronic device; and
   over-molding a movable component to engage a portion of the housing such that the movable component is slidably attached to the portion of the housing.

2. The method of claim 1, wherein the electronic device is operable to store data and the movable component is configured to switch between a first position in which data can be written to the electronic device and a second position in which data cannot be written to the electronic device.

3. The method of claim 1, wherein the movable component is molded to a rail on a side portion of the housing.

4. The method of claim 1, wherein the movable component is operable to change an operation of the electronic device.

5. The method of claim 1, wherein the movable component comprises a dissimilar material from a material of the housing.

6. The method of claim 1, wherein the movable component is a thermoplastic material.

7. The method of claim 6, wherein the thermoplastic material has a lower melting point than a melting point of the base and the lid such that the movable component does not bond to the housing.

8. The method of claim 1, wherein the electronic device is a thin walled semiconductor device.

9. The method of claim 1, wherein the electronic device is a printed circuit board.

10. The method of claim 9, wherein the printed circuit board is a flash memory module.

11. The method of claim 1, further comprising:
    adhering the electronic device to the base prior to over-molding the lid.

12. The method of claim 1, wherein positioning an electronic device on a base comprises positioning the electronic device within a recess formed in the base.

13. The method of claim 1, wherein the base includes one or more raised members and the electronic device includes one or more corresponding recesses, and wherein positioning the electronic device on the base comprises engaging the one or more raised members within the one or more recesses.

14. The method of claim 1, wherein over-molding a lid comprises including an opening in the lid to provide access to an interface on the electronic device.

15. The method of claim 1, wherein the base includes an opening to provide access to an interface on the electronic device.

16. The method of claim 15, wherein over-molding a lid comprises including an opening to provide a second access to an interface on the electronic device.

17. The method of claim 1, wherein the base is formed from a thermoplastic material.

18. The method of claim 1, wherein the lid is formed from a thermoplastic material.

19. The method of claim 18, wherein the thermoplastic material is acrylonitrile butadiene styrene (ABS).

20. A method of housing an electronic device, comprising:
    molding a base;
    positioning an electronic device on the base;
    over-molding a lid onto at least a portion of the base and a portion of the electronic device, the lid and the base comprising a housing for the electronic device; and
    over-molding a movable component to engage a portion of the housing such that the movable component is slidably attached to a portion of the housing.

21. A method of housing an electronic device, comprising:
    receiving a housing for an electronic device comprising a base and a lid; and
    over-molding a movable component to engage a portion of the housing such that the movable component is slidably attached to the portion of the housing.

22. A method of assembling a housing for an electronic device, comprising:
    positioning an electronic device housed within a housing in a first mold cavity of an assembly mold;
    molding a movable component in a second mold cavity of the assembly mold; and
    attaching the movable component to engage the housing while both the movable component and the housing are within the assembly mold such that the movable component is slidably attached to a portion of the housing.

23. The method of claim 22, wherein the electronic device is operable to store data and the movable component is configured to switch between a first position in which data can be written to the electronic device and a second position in which data cannot be written to the electronic device.

24. The method of claim 22, wherein the movable component is attached to a rail on a side portion of the housing.

25. The method of claim 22, wherein the movable component is operable to change an operation of the electronic device.

26. The method of claim 22, wherein the movable component comprises a dissimilar material from a material of the base and the lid.

27. The method of claim 22, wherein the movable component is a thermoplastic material.

28. The method of claim 22, wherein attaching the movable component to the housing further comprises moving one or more movable blocks within the assembly mold to advance the movable component to the housing.

29. A method for housing an electronic device, comprising:
    positioning a base within a first mold cavity of an assembly mold;
    positioning an electronic device on the base;
    over-molding a lid onto at least a portion of the base and a portion of the electronic device, the lid and the base comprising a housing for the electronic device;
    molding a movable component in a second mold cavity of the assembly mold; and
    attaching the movable component to engage the housing while both the movable component and the housing are within the assembly mold such that the movable component is slidably attached to a portion of the housing.

30. The method of claim 29, wherein the electronic device is operable to store data and the movable component is configured to switch between a first position in which data can be written to the electronic device and a second position in which data cannot be written to the electronic device.

31. A method for housing an electronic device, comprising:
    molding a base within a first mold cavity of an assembly mold;
    positioning an electronic device on the base;
    over-molding a lid onto at least a portion of the base and a portion of the electronic device, the lid and the base comprising a housing for the electronic device;

molding a movable component in a second mold cavity of the assembly mold; and attaching the movable component to engage the housing while both the movable component and the housing are within the assembly mold such that the movable component is slidably attached to a portion of the housing.

32. The method of claim 31, wherein the electronic device is operable to store data and the movable component is configured to switch between a first position in which data can be written to the electronic device and a second position in which data cannot be written to the electronic device.

33. The method of claim 31, wherein attaching the movable component to the housing further comprises moving one or more movable blocks within the assembly mold to advance the movable component to the housing.

\* \* \* \* \*